United States Patent
Schenk et al.

(10) Patent No.: US 11,031,492 B2
(45) Date of Patent: Jun. 8, 2021

(54) SEMICONDUCTOR STRUCTURE COMPRISING III-N MATERIAL

(71) Applicant: Exagan, Grenoble (FR)

(72) Inventors: David Schenk, Fontaine (FR); Alexis Bavard, Sassenage (FR)

(73) Assignee: Exagan, Grenoble (FR)

(*) Notice: Subject to any disclaimer, the term of this patent is extended or adjusted under 35 U.S.C. 154(b) by 237 days.

(21) Appl. No.: 16/091,478

(22) PCT Filed: Mar. 1, 2017

(86) PCT No.: PCT/FR2017/050467
§ 371 (c)(1),
(2) Date: Oct. 4, 2018

(87) PCT Pub. No.: WO2017/174885
PCT Pub. Date: Oct. 12, 2017

(65) Prior Publication Data
US 2020/0185515 A1 Jun. 11, 2020

(30) Foreign Application Priority Data
Apr. 5, 2016 (FR) ...................... 1652983

(51) Int. Cl.
*H01L 29/778* (2006.01)
*H01L 29/15* (2006.01)
(Continued)

(52) U.S. Cl.
CPC .... *H01L 29/7783* (2013.01); *H01L 21/02455* (2013.01); *H01L 29/15* (2013.01); *H01L 29/66462* (2013.01)

(58) Field of Classification Search
CPC .......... H01L 29/7783; H01L 21/02455; H01L 29/15; H01L 29/66462; H01L 21/02433;
(Continued)

(56) References Cited

U.S. PATENT DOCUMENTS

2006/0191474 A1* 8/2006 Chen ................. H01L 21/02381
117/104
2014/0327013 A1* 11/2014 Schenk ................. B82Y 20/00
257/76
(Continued)

FOREIGN PATENT DOCUMENTS

| EP | 1290721 B1 | 1/2015 |
| WO | 02/29873 A1 | 4/2002 |

(Continued)

OTHER PUBLICATIONS

Feltin et al. Stress control in GaN grown on silicon (111) by metalorganic vapor phase epitaxy. Appl. Phys. Lett. 79, 3230 (2001); https://doi.org/10.1063/1.1415043 (Year: 2001).*
(Continued)

*Primary Examiner* — Hoang-Quan Ho
(74) *Attorney, Agent, or Firm* — TraskBritt

(57) ABSTRACT

A semiconductor structure comprising III-N materials, includes: a support substrate; a main layer of III-N material, the main layer comprising a first section disposed on the support substrate and a second section disposed on the first section; an inter-layer of III-N material, disposed between the first section and the second section in order to compress the second section of the main layer, wherein the structure's inter-layer consists of a lower layer disposed on the first section and an upper layer disposed on the lower layer and formed by a superlattice.

8 Claims, 2 Drawing Sheets

(51) Int. Cl.
  *H01L 21/02* (2006.01)
  *H01L 29/66* (2006.01)

(58) Field of Classification Search
  CPC ......... H01L 21/02458; H01L 21/02507; H01L 21/0254; H01L 21/02579; H01L 21/02581; H01L 21/0262; H01L 21/02381; H01L 29/778; H01L 29/04
  See application file for complete search history.

(56) References Cited

U.S. PATENT DOCUMENTS

2015/0357419 A1\* 12/2015 Lutgen .............. H01L 21/02458 257/22
2016/0149000 A1 5/2016 Sazawa

FOREIGN PATENT DOCUMENTS

WO 2013/001014 A1 1/2013
WO 2015/015800 A1 5/2015

OTHER PUBLICATIONS

International Written Opinion for International Application No. PCT/FR2017/050467, dated Jun. 20, 2017, 8 pages.
International Search Report for International Application No. PCT/FR2017/050467, dated Jun. 20, 2017, 2 pages.
Feltin et al., Stress Control in GaN Grown on Silicon (111) by Metalorganic Vapor Phase Epitaxy, Appl. Phys. Lett. vol. 789, (2001), Abstract only.
Khan et al., High Electron Mobility Transistor Based on a GaN-AlxGa1 Heterojunction, Applied Physics Letters, vol. 63, No. 9, (Sep. 1993), pp. 12-14-1215.
European Communication pursuant to Article 94(3) EPC for European Application No. 17711720, dated Jul. 12, 2019, 13 pages with English translation.
Korean Notification of Reason for Refusal for Korean Application No. 952021008313307 dated Jan. 28m 2021, 8 pages.

\* cited by examiner

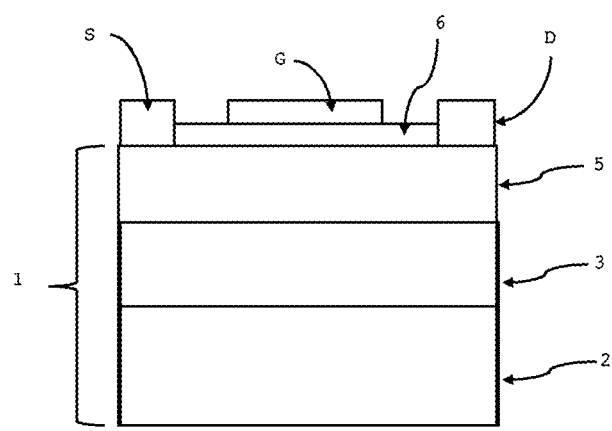
FIG. 1: PRIOR ART
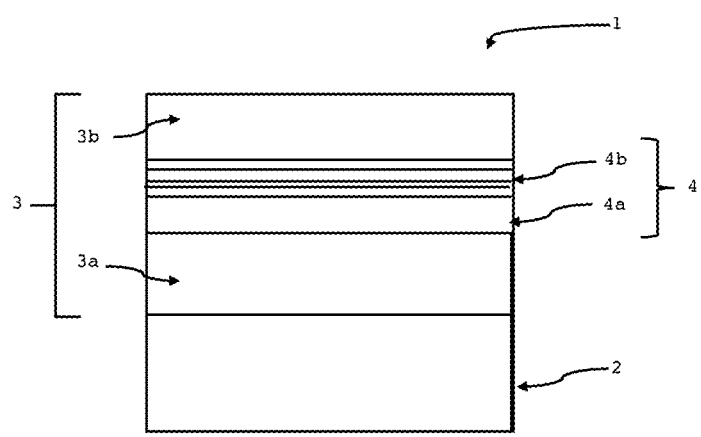
FIG. 2

SEMICONDUCTOR STRUCTURE COMPRISING III-N MATERIAL

CROSS-REFERENCE TO RELATED APPLICATIONS

This application is a national phase entry under 35 U.S.C. § 371 of International Patent Application PCT/FR2017/050467, filed Mar. 1, 2017, designating the United States of America and published as International Patent Publication WO 2017/174885 A1 on Oct. 12, 2017, which claims the benefit under Article 8 of the Patent Cooperation Treaty to French Patent Application Ser. No. 1652983, filed Apr. 5, 2016.

TECHNICAL FIELD

This disclosure relates to a semiconductor structure comprising III-N materials.

BACKGROUND

The semiconductor structures comprising III-N materials are particularly useful for receiving transistors of the HEMT (High Electron Mobility Transistor) type that spin off, for instance, as a switch in power converters.

The document "High Electron Mobility Transistor Based on a GaN—AlGaN Heterojunction," M. A. Kahn et al., Applied Physics Letters, Vol. 63, No. 9 of 30 Aug. 1993, discloses a semiconductor structure 1 provided with such a HEMT. As shown schematically in FIG. 1, this assembly consists of:
- a sapphire substrate 2 and a main layer 3 of A1N forming the semiconductor structure 1;
- a heterojunction consisting of a GaN channel layer 5 and an AlGaN barrier layer 6 successively formed on the semiconductor structure;
- source S, drain D and gate G electrodes on/in the heterojunction.

The electrically conducting state of the transistor between the source S and drain D is controlled by the voltage applied to the gate G.

Thus, when the voltage applied to the gate G exceeds a threshold voltage Vt, the transistor is on. In the case of power application, several amperes, even several tens of amperes, can flow in the channel layer between the source S and drain D. The voltage $V_{DS}$ that develops in this case between the two electrodes ranges from a few volts to a few dozen volts, and is related to the resistivity of the channel layer material.

When the voltage applied to the gate G is lower than the threshold voltage Vt, the transistor is off. In the case of power application, the voltage $V_{DS}$ that applies across the terminals of the source S and drain D electrodes can then range from a few hundred volts to a few thousand volts. The leakage current flowing between the source S and the drain D is low, up to a few nanoamperes per mm of gate width.

By controlling the gate voltage, the transistor can be switched very rapidly (within nanoseconds) between an on state and an off state.

Several problems, however, limit the spread of this technology.

As discussed, in the off state, a high voltage is applied across the terminals of the source S and drain D electrodes. This leads to the formation of an electric field whose lines penetrate very deep into the main layer 3 and the substrate 2. An electric field, which may be of high intensity, then develops between the drain electrode D and the substrate 2, particularly in the thickness of the main layer 3, and between the source S and drain D. In order to avoid the intensity of this field exceeding the critical value (known as the breakdown field) at which the material can no longer support it, provision must be made to separate the drain D and the source S by a sufficient distance d such that for a given voltage $V_{DS}$, the field strength $E=V_{DS}/d$ is less than the breakdown field. Similarly, a main layer 3 must be provided with sufficient thickness such that the voltage that develops between the substrate 2 and the drain D (which may be up to $V_{DS}$) leads to a field strength that is also lower in the materials involved than the breakdown field.

It is relatively easy to choose the distance d between the drain D and the source S electrode when designing the transistor. Thus, for a voltage $V_{DS}$ ranging from 400 V to 2000 V, one can choose a distance ranging from 5 microns to 20 microns.

Providing a semiconductor structure 1 having a main layer 3 of sufficiently thick III-N materials (about 3 microns or more) is, however, much more difficult, especially when the selected substrate 2 is made of silicon rather than sapphire because of availability and cost.

As such, documents EP1290721 and WO 2013/001014 provide examples of known techniques for growing a thick main layer 3 of a III-N material on a support substrate 2, which may be made of silicon. These techniques include inserting into the buffer layer made of III-N materials at least one interlayer, also made of III-N material, whose nature is chosen in order to compress a portion of the buffer layer with which it comes into contact.

Another problem that limits the spread of the technology, concerns the leakage current flowing in the thickness of the main layer 3 between the source S and the drain D when the transistor is in the off state. Of course, it is hoped that this current be as little as possible. That is why the main layer 3 is generally doped with a p-type doping agent, such as iron, carbon or magnesium, to make it resistive and limit in such manner the flow of leakage currents.

However, experience shows that despite the resistive doping, the semiconductor structure 1 may have an excessive leakage current for the intended applications.

Also known are the documents "Stress Control in GaN Grown on Silicon (111) by Metalorganic Vapor Phase Epitaxy," by E. Feltin et al., Applied Physics Letters, Vol. 79, No. 20 of 12 Nov. 2001; US 2006/191474 and WO 0229873 showing different techniques of growing a main layer of a III-N material on a substrate, which may be made of silicon. These techniques make provision for inserting a superlattice in the formed structure and observe an improvement of the crystal quality of the main layer, and particularly its dislocation density. But these documents do not address the current problem of leakage current that can be formed in the thickness of the structure; this problem remains unresolved.

BRIEF SUMMARY

The present disclosure aims to overcome all or part of the aforementioned drawbacks. It particularly aims at providing a semiconductor structure having, on a support substrate, a thick main layer that is highly resistive in order to form a transistor that can withstand high voltages, and limiting the intensity of leakage currents.

In order to achieve one of these aims, the purpose of the disclosure is to provide a semiconductor structure comprising III-N materials made up of:

a support substrate;

a main layer made of III-N material, the main layer having a first section disposed on the support substrate and a second section disposed on the first section;

an interlayer of III-N material disposed between the first section and the second section in order to compress the second section of the main layer, wherein, the interlayer comprises:

a lower layer disposed on the first section of the main layer;

an upper layer disposed on and in contact with the lower layer formed by a superlattice, and wherein, the lower layer has a higher dislocation density than the upper layer.

The interlayer thus formed is particularly effective in limiting the leakage current or the density of leakage current in the structure.

According to other advantageous and non-exhaustive characteristics of the disclosure, considered individually in accordance with any technically feasible combination:

the lower layer consists of a superlattice, different from the superlattice forming the upper layer, or of a homogeneous layer;

the lattice parameter of the material that forms the lower layer is smaller than the lattice parameter of the material forming the upper layer;

the lattice parameter of the material that forms the upper layer is smaller than the lattice parameter of the material forming the lower layer;

the main layer and the interlayer are monocrystalline;

the semiconductor structure comprises a second interlayer on the second section of the main layer and a third section of the main layer disposed on the second interlayer;

the second interlayer consists of a homogeneous layer, a superlattice, or a combination thereof;

at least the upper layer comprises a p-type doping agent;

the support substrate has a lower coefficient of thermal expansion than that of the main layer.

The disclosure also relates to a semiconductor silicon wafer or an integrated circuit device comprising a semiconductor structure as shown.

It also relates to a method of manufacturing a semiconductor structure comprising III-N materials on a support substrate, the method comprising:

the formation of a main layer made of III-N material on the carrier substrate, the main layer having a first section and a second section disposed on the first section;

the formation of an interlayer made of III-N material disposed between the first section and the second section in order to compress the second section of the main layer.

According to the disclosure, the formation of the interlayer comprises:

the formation, at a first temperature, of a lower layer disposed on the first section of the main layer;

and the formation, at a second temperature, of an upper layer formed by a superlattice and disposed on and in contact with the lower layer.

The first temperature is lower than the second temperature.

According to other advantageous and non-exhaustive characteristics of this method, considered individually or according to any technically feasible combination:

the first temperature is lower than 1000° C.;

the second temperature ranges between 1050° C. and 1100° C.

BRIEF DESCRIPTION OF THE DRAWINGS

Other features and advantages of the disclosure will emerge from the detailed description that follows, with reference to the accompanying drawings in which:

FIG. 1 shows a prior art semiconductor structure having a HEMT;

FIG. 2 shows a semiconductor structure comprising III-N materials according to the present disclosure;

DETAILED DESCRIPTION

Figure 3:
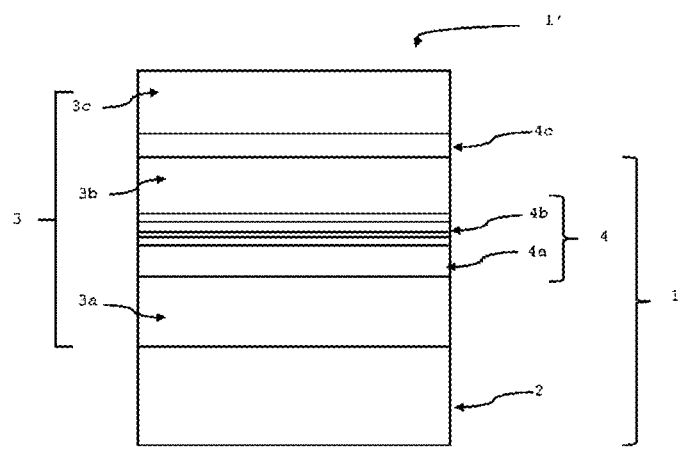
FIG. 3 shows another semiconductor structure comprising III-N materials according to the present disclosure.

To simplify the forthcoming description, the same references are used for identical elements or performing the same function in the different embodiments of the present disclosure or in the presentation of the background of the disclosure.

FIG. 2 shows a semiconductor structure comprising III-N materials according to the present disclosure.

The semiconductor structure 1 may take the form of a standard size, circular semiconductor wafer, for example, 150 mm, 200 mm or even 300 mm, but the disclosure is not limited to this shape or these dimensions. Thus, where and when the semiconductor structure 1 forms part of a singled out, finished or semi-finished, integrated circuit device, it will either take the shape of a rectangular or square block of material, measuring just a few millimeters to a few centimeters, with the dimensions of the integrated circuit device.

Whatever its shape, the semiconductor structure 1 comprises a support substrate 2 capable of receiving a crystalline layer epitaxially made of III-N material. For reasons of cost and availability, the support substrate 2 is advantageously made of monocrystalline silicon, preferably crystalline orientation (111), but the disclosure is not limited to this material and this orientation. Alternatively, it may be made of silicon carbide, massive gallium nitride, silicon (110) or (001) or an advanced substrate such as silicon-on-insulator or silicon carbide-on-insulator.

Semiconductor structure 1 also comprises a monocrystalline main layer 3 made of III-N material on the support substrate 2. The term "III-N material" means any material, alloy or material stack or the generic form alloy $B_wAl_xGa_yIn_zN$ where $w+x+y+z=1$. The main layer 3 comprises a first section 3a provided on the support substrate 2 and a second section 3b disposed on the first section 3a.

The nature of the main layer 3 is not necessarily the same throughout its thickness. Thus, sections 3a, 3b may have different compositions from each other. In addition, each section 3a, 3b may also be made up of a plurality of different sub-layers of composition or nature from each other.

The main layer 3 provides a material thickness that makes it possible to separate an integrated circuit device formed on the semiconductor structure 1 from the support substrate 2. This limits the intensity of the electric field that develops between the support substrate 2 and the source S or drain D electrode, for a given voltage when the device is "on."

Advantageously, the thickness of the main layer 3 (that is to say, the thickness of material between the upper face of the support substrate 2 and the free face of the semiconductor structure 1) is greater than 3 microns, or 5 microns or 10 microns. A considerable thickness makes it possible to form an integrated circuit device on the semiconductor structure 1 that can be subjected to a high voltage without breaking down (more than 1000 V, for example).

Preferably, and in order to limit the leakage currents that can circulate in the semiconductor structure 1 when the latter is provided with an integrated circuit device, the main layer 3 is doped to make it resistive. For example, this may be a carbon doping whose concentration in the main layer may be between $5\times10^{18}$ and $5\times10^{19}$ at/cm$^3$. It can also be of another p-type doping agent, for example, iron or magnesium.

This concentration is not necessarily uniform in the main layer 3 and in the sections 3a, 3b of the main layer 3. It can vary within this layer and/or the sections 3a, 3b, particularly in a perpendicular direction to the support substrate 2.

For instance, the first section 3a of the main layer 3, which is in contact with the support substrate 2, may comprise a first nucleation sublayer, in contact with the support substrate 2, of a few hundred nm thick, for example, made of AlN (not shown in FIG. 2), facilitating the epitaxy of the rest of the main layer 3 on the support substrate 2. This nucleation sublayer made of AlN is particularly useful when the support substrate 2 is made of silicon. On the nucleation sublayer, the first section 3a may also comprise one or more other sub-layers, for example, GaN or AlGaN, a homogeneous composition or as superlattice (these terms will be defined later).

As discussed in the documents mentioned in the background of the disclosure, the difference in coefficients of thermal expansion that may exist between the support substrate 2 and the monocrystalline main layer 3 can lead to the generation of high stress in these elements during high-temperature formation of the main layer 3 and/or after its formation, especially when cooling the structure. When the support substrate 2 has a coefficient of thermal expansion that is less than that of the main layer 3, this layer, after its high-temperature formation and return to ambient temperature, is subjected to tensile stress that can lead to its stress cracking. This is particularly the case when the main layer 3 has a thickness greater than a few microns.

In order to limit this effect and prevent the occurrence of cracks in the main layer 3, which would make the semiconductor structure 1 unable to receive an integrated circuit device, the disclosure provides an interlayer 4 made of monocrystalline III-N material interposed in the main layer 3 and disposed between the first section 3a and the second section 3b. This interlayer 4 is configured in order to compress the second section 3b of the main layer 3, during its high-temperature epitaxial formation. During the return to ambient temperature, this compression offsets the tensile stresses that can lead to its cracking when the support substrate 2 has a lower coefficient of thermal expansion than the main layer 3.

According to the disclosure, the interlayer 4 is composed of a lower layer 4a disposed on the first section 3a of the main layer 3 and an upper layer 4b disposed on and in contact with, the lower layer 4a.

To help in effectively compressing the second section 3b of the main layer 3, the nature and composition of the interlayer 4 are chosen so that the lattice parameter of the material forming the lower layer 4a is smaller than the lattice parameter of the material forming the upper layer 4b. The former is preferred for being smaller than the lattice parameter of the material forming the second section 3b. For the same reason of effectively compressing the second section 3b of the main layer 3, the upper layer 4b is directly in contact with the lower layer 4a. For clarity, it should be specified that the term "lattice parameter of a layer of material" refers to the lattice parameter of the material in the plane defined by the layer.

The lower layer 4a may have a uniform composition. Alternatively, it may be formed by a superlattice. In both cases, the main function of the lower layer 4a is to compress the second section 3b of the main layer 3. To facilitate this compression, and as recalled in document US2006/0191474 mentioned in the background of the disclosure, the lower layer 4a is formed at a first relatively low temperature, for example, below 1000° C. In consequence thereof, it has a lower crystalline quality and, more particularly, has a concentration of threading dislocations that can reach $10^{10}$ or $10^{11}$ per cm$^2$, as may be determined by a TEM or SEM analysis. This concentration is much greater than the concentration dislocations present in the layers obtained at a second more conventional temperature of over 1000° C. and typically between 1050° C. and 1100° C. during the MOCVD formation of layers made of III-N materials. These dislocations form preferred passages for current and, therefore, lead to decreasing the electrical resistivity of the structure.

Hence, according to the disclosure, the interlayer 4 also comprises an upper layer 4b formed by a superlattice. The upper layer 4b is formed at a second conventional temperature above the first temperature. It may be well above 1000° C., and typically between 1050° C. and 1100° C. The upper layer 4b has a dislocation density lower than that of the lower layer 4a. In addition to its contribution to the stress of the second section 3b of the main layer, the upper layer 4b is particularly effective for improving the electrical properties of the stack and offsetting electrical faults of the lower layer 4a on which it rests.

The term "superlattice," and according to the usual definition in the field of semiconductors, means a periodic stack of thin layers, for example, between 0.5 nm and 20 nm or even 50 nm. As this is well known per se, a superlattice layer formed is macroscopically similar to a uniform composition layer, as can be visible by photoluminescence or cathodoluminescence diffraction ray analysis. It should be specified that the lattice parameter of a superlattice layer corresponds to the lattice parameter of the equivalent uniform layer (whose composition can be visible by photoluminescence or cathodoluminescence X-ray diffraction).

This is similar to what was shown for the main layer 3, and for the same reasons, the lower and/or upper layers 4a, 4b are advantageously doped (p-type) to make them resistive. It may be a carbon, iron or magnesium doping in a concentration, which may range from $5\times10^{18}$ to $5\times10^{19}$ at/cm$^3$.

Advantageously, the interlayer 4 has a thickness that may be between 10 nm and 1000 nm or between 200 nm and 1000 nm in order to maintain the effective compression of parts of the second section 3b of the main layer 3, without requiring any excessive thickness. In general, each of the upper and lower layers 4b, 4a, may have a thickness of between 10 nm and about 1000 nm.

Where and when both the lower layer 4a and the upper layer 4b are superlattices, they have different densities of threading dislocations, such that it is possible to distinguish two distinct layers from each other in the stack.

Forming the upper layer 4b shaped as a superlattice rather than as a uniform layer has many advantages.

First and foremost, it is possible to highly dope this layer (e.g., with carbon and in the above-mentioned concentration range of $5\times10^{18}$ to $5\times10^{19}$ at/cm$^3$) without damaging the crystalline quality of these layers.

Indeed, it is sometimes observed that a high concentration of doping agent in a uniform layer of III-N material can result in the formation of holes or other surface morphological defects. These defects result in making the semiconductor structure that contains them unfit to receive an integrated circuit device, particularly a high-performance, power device. They lead to high leakage currents and reduced breakdown voltage.

The upper layer $4b$ embodied as a superlattice prevents the appearance of these defects, even when these layers are doped at high concentration. Advantageously, at least this layer is doped at high concentration (for example, with carbon and in the above concentration range from $5 \times 10^{18}$ to $5 \times 10^{19}$ at/cm$^3$). Provision can then be made for an interlayer 4 and a highly resistive semiconductor structure 1 that limit the leakage currents of an integrated circuit device formed on such a semiconductor structure 1.

In addition, many interfaces that make up the stack of layers forming the superlattice appear beneficial for insulating and limiting leakage currents of the semiconductor structure 1. In particular, they prevent or limit the occurrence of a conductive electronic plane (which enhances the flow of leakage currents) under the upper layer $4b$ (and beneath the lower layer $4a$ when the latter is formed from a superlattice), which sometimes occurs when the interlayer 4 consists of a uniform layer (forming a heterojunction with the underlying layer) of the background of the disclosure. In general, the superlattice upper layer $4b$ forms an effective barrier for free carriers of the semiconductor structure 1.

Generally, the superlattice forming the upper layer $4b$ and, if necessary, the lower layer $4a$, can be formed of a pattern repetition, the pattern comprising at least two layers. The first layer has the general composition $Al_{w1}GaN_{x1}In_{y1}B_{z1}N$ with w1+x1+y1+z1=1 and the second layer has the general shape $Al_{w2}GaN_{x2}In_{y2}B_{z2}N$ with w2+x2+y2+z2=1. The natures of the two layers are different, that is to say, at least two of the pairs (w1, w2), (x1, x2), (y1, y2), (z1, z2) are different.

Each layer that forms the pattern is very thin, typically between 0.5 nm and 20 nm, or even 50 nm. Preferably, layer thicknesses should be chosen so as to be less than their critical thicknesses and limit the formation of dislocations. But the disclosure is not limited to this superlattice shape, and may provide a degree of relaxation in layers. Furthermore, the layer thicknesses of the pattern may be mutually identical or different.

The pattern constituting the upper layer $4b$ may be repeated from 2 to 500 times, depending on the respective layer thicknesses that it comprises, so as to form an upper layer $4b$ having a thickness of between 10 nanometers and about 1000 nanometers. The same applies to the pattern constituting the lower layer $4a$, when it is comprised of a superlattice.

The interlayer 4 is preferably centrally placed within the thickness of the main layer 3, that is to say, the thicknesses of the first section $3a$ and the second section $3b$ may be substantially identical (close to 50%). Stresses that develop in the material can be efficiently controlled during manufacture.

For example, provision may be made to insert the interlayer 4 in the main layer 3 so that the sections $3a$, $3b$ each have a thickness of less than 2 microns, 2.5 microns or 3 microns.

The semiconductor structure 1 may have more than one interlayer, particularly when the thickness of the main layer 3 is significant, especially more than 5 microns.

Thus, FIG. 3 shows a semiconductor structure $1'$ comprising a semiconductor structure 1 similar in all respects to that shown in FIG. 2, which has been described in detail. On this semiconductor structure 1, and more precisely on the second section $3b$ of the main layer, a second monocrystalline interlayer $4c$ has been formed, on which is disposed a third section $3c$ of the monocrystalline main layer 3. The second interlayer $4c$ compresses the third section $3c$ of the main layer 3. The material that the second interlayer $4c$ is composed of has a lower lattice parameter than the material that makes up the third section $3c$ of the main layer 3.

The second interlayer $4c$ may take any suitable shape: it may be composed or comprised of a uniform layer, a superlattice, or a combination thereof. It may, in particular, be composed of a lower layer and an upper layer similar to what has been described in connection with interlayer 4.

A structure composed of a second interlayer $4c$ and of a third section $3c$ may be stacked as many times as necessary on the semiconductor structure 1 in order to form a main layer 3 of substantial thickness and satisfactory crystalline quality.

Whatever the selected stack, the semiconductor structure 1, $1'$ of the present disclosure is achieved by growth, for example, by vapor phase epitaxy ("Metal Organic Chemical Vapor Deposition") or "Molecular Beam Epitaxy."

In order to grow the main layer 3 and the interlayers $4a$, $4b$, $4c$, the support substrate 2 (or a plurality of support substrates) is placed in a deposition chamber of conventional equipment.

As is well known per se, the support substrate 2 may be prepared prior to deposition so as to remove a native oxide layer from its surface.

In the case of a deposit according to the MOCVD technology, the chamber is crossed by precursor and carrier gas flows, at high temperatures typically between 1050° C. and 1150° C. for most of the layers that form the structure, and kept at a pressure of about 100 mbar, and typically between 50 mbar and 200 mbar. The growth conditions, i.e., temperature, pressure, gas flows are used to select the composition, quality and thickness of each stacking element forming the semiconductor structure 1, $1'$. As noted previously, the lower layer $4a$ is formed at a first relatively low temperature, below the formation temperature of the upper layer $4b$, in order to facilitate the stressing of the second section $3b$ of the main layer 3. The other layers of the structure, including the upper layer $4b$ of the interlayer 4 is formed at a relatively high temperature, about 1050° C. to 1100° C. For example, the precursor gas of the element Ga may be tri-methyl gallium (composition $Ga(CH_3)_3$) or tri-ethylgallium (composition $Ga(C_2H_5)_3$), the precursor gas of the element Al may be tri-methyl aluminum (composition $Al_2(CH_3)_6$) or tri-ethyl aluminum (composition $Al_2(C_2H_5)_6$); the precursor of element III may be ammonia ($NH_3$); and the carrier gas may comprise or consist of hydrogen and/or nitrogen.

When at least one precursor gas is carbon, such as those listed as the example above, the growing conditions also help control the proportion of carbon that is incorporated into the layers during the growing in order to dope them intrinsically. Alternatively, an additional p-type extrinsic doping source may be used to make some layers resistive. This may be an iron, a carbon or a magnesium doping source. In the case of carbon doping, the extrinsic doping source may be $CCl_4$, $CBr_4$, $C_2H_2$, $C_2H_4$, $C_6H_{12}$, etc.

Example 1

A wafer of 200 mm silicon 111 is placed in a deposition chamber of an AIXTRON® or a VEECO®-type MOCVD reactor. An AlN nucleation layer of 100 nm to 300 nm thick is first formed on this wafer. Then a main layer 3 of GaN 5 microns thick is formed on the nucleation layer. Inserted in this main layer 3, two microns from the support, an interlayer 4 has been formed. This interlayer is composed of a lower layer 4a of uniform AlN composition with a thickness of 17 nm. This layer has a dislocation density above $10^{10}/cm^2$. On this lower layer 4a, a superlattice upper layer 4b is formed consisting of 100 repetitions of a pattern formed from a first layer of AlGaN having a 20% Al concentration and a thickness of 1 nm, and a second GaN layer having a thickness of 1 nm. This layer has a dislocation density below $10^{10}/cm^2$.

The interlayer 4 thus has a 217 nm thickness and the superlattice upper layer 4b is macroscopically similar to a homogeneous AlGaN layer whose aluminum content is 10%. The AlN layer forming the lower layer and, to a certain extent, the superlattice forming the upper layer 4b, have a smaller lattice parameter than that of the GaN constituting the main layer 3, and which enables the section of this main layer 3 to remain compressed.

In this example, the main layer 3 and the interlayers 4a, 4b are all doped with carbon at a concentration of about $10^{19}$ at/cm$^3$ during their growth. The main layer 3 of GaN has satisfactory crystalline quality and has no particular cracking, which would make it unfit for receiving an integrated circuit device.

Example 2

This example is identical to the previous one, except that, in this example, the interlayer comprises a lower superlattice layer 4a. Thus, the lower layer 4a is composed of 10 repetitions of a pattern formed by a first AlN layer having a thickness of 1 nm and a second GaN layer having a thickness of 0.5 nm. The lower superlattice layer 4a is macroscopically similar to a homogeneous AlGaN layer having a thickness of 15 nm and an aluminum content of 66%.

Example 3

This example relates to a semiconductor structure having two interlayers. In Example 3, a second interlayer consisting of a uniform layer of AlGaN having a concentration of 80% aluminum and a thickness of 20 nm is formed on the semiconductor structure of Example 1. A third GaN section having a thickness of 1 micron is formed on the AlGaN layer.

Example 4

This example is an alternative structure to that shown in Example 3. In this Example 4, the second interlayer consists of a superlattice. The superlattice is formed from five repetitions of a pattern formed from an AlN layer having a thickness of 2 nm and a layer of AlGaN (60% Al) having a thickness of 2 nm.

Counter-Example 1

This counter-example is similar to the structure of Example 1 wherein the upper superlattice layer 4b has been replaced by a uniform upper layer of AlGaN (10% aluminum content) having a thickness of 200 nm. In other words, the only difference between the semiconductor structure of Example 1 and Counter-Example 1 is that in Example 1, the upper layer is made in the form of a superlattice while in Counter-Example 1, the upper layer is made in the form of a homogeneous layer.

Figure 4:
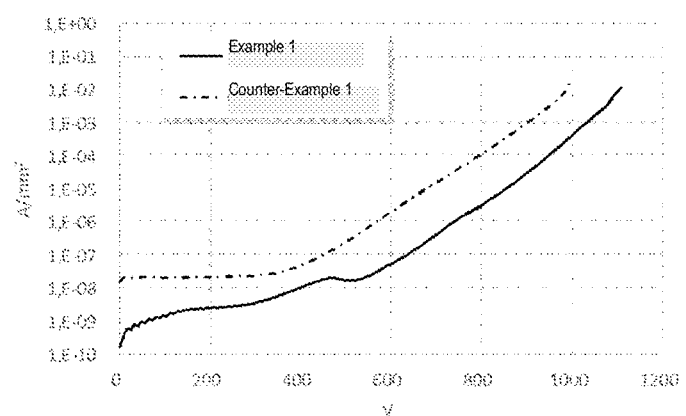
FIG. 4 graphically illustrates the leakage current performance of a semiconductor structure according to the present disclosure.

FIG. 4 graphically illustrates efficiency in density of leakage current of the structure in Example 1 and the structure in Counter-Example 1.

The x-axis represents a vertical voltage (expressed in volts) applied on both sides of the structure, i.e., between the free face of the support substrate 2, on the one hand, and the free face of the main layer 3, on the other hand. The y-axis represents the current density flowing between these two surfaces (expressed in Amperes/mm$^2$ and on a logarithmic scale).

Based on the voltage applied, the density of leakage current in the case of the semiconductor structure in Example 1 is shown in this graph by the solid line. Based on the voltage applied, the density of leakage current in the case of the semiconductor structure in Counter-Example 1 is shown in this graph by the dotted line. The measurements were performed at ambient temperature.

It has been observed that the structure of Example 1 saves about one order of current density, regardless of the voltage applied to at least 1000 volts. It is, therefore, understood that an integrated circuit device (such as an HEMT device) having a defined geometry formed on the structure of Example 1 has a leakage current of about ten times less than the same device, also having the same geometry, but formed on the structure of Counter-Example 1.

Although the benefits of semiconductor structure 1 in a power application have been shown when it is equipped with an integrated HEMT-type device, the disclosure is not limited to this application or to this type of device. The semiconductor structure 1 of the present disclosure will, therefore, be beneficial in the field of radio frequencies, light-emitting diodes and any other application or device for which the electrical properties described are advantageous.

The invention claimed is:
1. A semiconductor structure including III-N materials, comprising:
 a support substrate;
 a main layer made of III-N material, the main layer having a first section disposed on the support substrate and a second section disposed over the first section;
 an interlayer made of III-N material disposed between the first section and the second section for compressing the second section of the main layer, wherein the interlayer comprises:
  a lower layer disposed on the first section of the main layer; and
  an upper layer disposed on and in contact with the lower layer formed by a superlattice, wherein the lower layer consists essentially of a homogeneous layer or a superlattice which is different from the superlattice constituting the upper layer, having a dislocation density greater than that of the upper layer and a lattice parameter smaller than a lattice parameter of the material forming the upper layer, the superlattice constituting the upper layer and, where appropriate, the superlattice constituting the lower layer being formed by a repetition of a pattern comprising at least two layers of different types; and
 wherein each layer making up the pattern has a thickness of between 0.5 nm and 50 nm, the interlayer has a thickness of between 200 nm and 1000 nm, and the upper layer comprises a p-type dopant of carbon, iron or magnesium in a concentration of between $5 \times 10^{18}$ and $5 \times 10^{19}$ at/cm$^3$ to make the layer resistive.

2. The semiconductor structure of claim 1, wherein the lattice parameter of the material forming the upper layer is smaller than the lattice parameter of the material forming the second section of the main layer.

3. The semiconductor structure of claim 1, wherein the main layer and the interlayer are monocrystalline.

4. The semiconductor structure of claim 1, further comprising a second interlayer on the second section of the main layer and a third section of the main layer disposed on the second interlayer.

5. The semiconductor structure of claim 4, wherein the second interlayer is formed by a uniform layer, a superlattice, or a combination thereof.

6. The semiconductor structure of claim 1, wherein the support substrate has a lower coefficient of thermal expansion than the main layer.

7. A semiconductor wafer comprising the semiconductor structure of claim 1.

8. An integrated circuit device comprising the semiconductor structure of claim 1.

\* \* \* \* \*